US007951303B2

United States Patent
Munekane

(10) Patent No.: US 7,951,303 B2
(45) Date of Patent: May 31, 2011

(54) METHOD OF FABRICATING GRABBING FACE OF SAMPLE GRABBING PORTION

(75) Inventor: Masanao Munekane, Chiba (JP)

(73) Assignee: Sii Nanotechnology Inc., Chiba (JP)

( * ) Notice: Subject to any disclaimer, the term of this patent is extended or adjusted under 35 U.S.C. 154(b) by 705 days.

(21) Appl. No.: 11/960,304

(22) Filed: Dec. 19, 2007

(65) Prior Publication Data

US 2008/0156770 A1 Jul. 3, 2008

(30) Foreign Application Priority Data

Dec. 21, 2006 (JP) ................................ 2006-344412

(51) Int. Cl.
 *C23F 1/00* (2006.01)
(52) U.S. Cl. ........................... 216/66; 216/94; 250/492.3
(58) Field of Classification Search .................... 216/66, 216/94; 250/492.3
 See application file for complete search history.

(56) References Cited

U.S. PATENT DOCUMENTS

| 2001/0032936 | A1* | 10/2001 | Iwasaki ...................... 250/491.1 |
| 2005/0066899 | A1* | 3/2005 | Fukuda et al. ............ 118/723 FI |
| 2005/0178980 | A1* | 8/2005 | Skidmore et al. ........ 250/492.21 |
| 2006/0043982 | A1* | 3/2006 | Shinada et al. ................ 324/751 |
| 2006/0216838 | A1* | 9/2006 | Munekane et al. ............. 438/14 |
| 2008/0302961 | A1* | 12/2008 | Tashiro et al. ................ 250/310 |

FOREIGN PATENT DOCUMENTS

| JP | 8-257926 A | 10/1996 |
| JP | 3109220 B | 9/2000 |
| JP | 2003-217494 A | 7/2003 |

* cited by examiner

*Primary Examiner* — Shamim Ahmed
(74) *Attorney, Agent, or Firm* — Brinks Hofer Gilson & Lione

(57) ABSTRACT

By working a grabbing portion by a charged particle beam of FIB or the like, the grabbing portion in parallel with the beam can be formed, and also dust adhered to the grabbing portion is removed. When a small sample represented by a TEM sample is fabricated by being cut out by etching by a charged particle beam and is carried at inside of an apparatus of irradiating a charged particle beam, the sample is etched in a direction of irradiating the charged particle beam, and therefore, a mechanism pinched by a grabbing face of a grabbing portion can be worked in a direction the same as that in working the sample, and therefore, a change in an attitude can be reduced when the sample and the grabbing face are fabricated by parallel faces.

10 Claims, 4 Drawing Sheets

FIG. 1
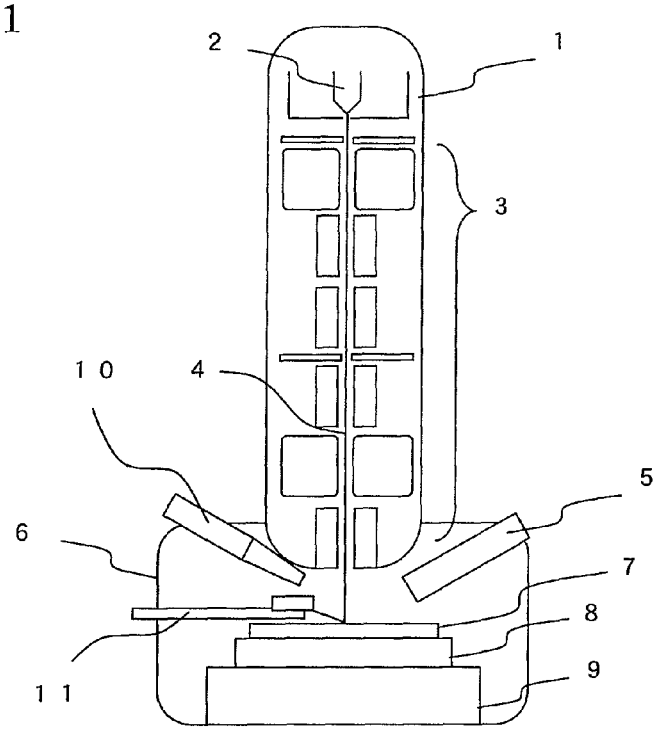
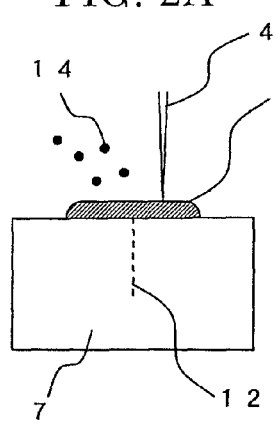
FIG. 2A
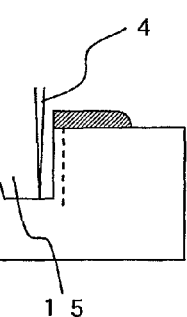
FIG. 2B
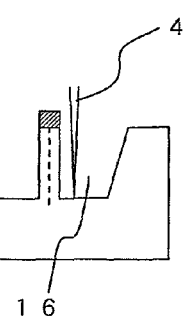
FIG. 2C
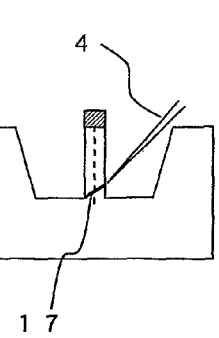
FIG. 2D

METHOD OF FABRICATING GRABBING FACE OF SAMPLE GRABBING PORTION

RELATED APPLICATIONS

This application claims priority under 35 U.S.C.§119 to Japanese Patent Application No. JP2006-344412 filed Dec. 21, 2006, the entire content of which is hereby incorporated by reference.

BACKGROUND OF THE INVENTION

The present invention relates to an analyzing apparatus such as a focused ion beam (FIB) apparatus, a scanning electron microscope (SEM), a transmission electron microscope (TEM), or a scanning probe microscope (SPM), and relates to a tool for handling, or separating, picking up, storing a small sample or the like and having a function of working a small sample used for TEM observation or grabbing and carrying a small sample in observation.

While observing a small sample by SEM or an FIB microscope (SIM), a portion of a conductor wafer or the like is cut out and picked up to be transferred to a sample base or the like to be fixed in cutting out a failed defect portion for working a TEM sample. There is means for transferring such a small picked-up sample constituted by using a single or a plurality of bimorph type piezoelectric elements, or finely moved by a stepping motor. At a front end of a driving portion, there is present a slender needle-like constitution referred to as prove, or a grabbing tool comprising a plurality of pieces of support members or the like. In the case of the probe, a sample is fixed by forming a deposition film between the front end of the probe and the sample by irradiating a charged particle beam while supplying a gas, a sample is attracted by static electricity of the front end to be transferred, and therefore, it is difficult to control a position of the sample in transferring the sample. Further, in the case of a grabbing member, when the sample is grabbed, it is a factor of determining a sample carrying success rate whether a shape thereof is easy to be grabbed, or an operability thereof is excellent.

JP-A-2003-217494 (page 2, FIG. 1) proposes a charged particle beam apparatus including a laminated type piezoelectric element block for handling a small part. Two sheets of plates having sharp front ends are constituted by bimorph type piezoelectric elements, and function as an opening/closing grabbing member by making the two sheets proximate to each other or remote from each other by applying a voltage. A small part constituting an object of observation is carried to an aimed location and thereafter connected to a power source line by a W deposited film by a focused ion beam in a gas atmosphere of W $(CO)_6$.

Japanese Patent Publication No. 3109220 proposes a gripper in which a grabbing member is constituted by a flexible finger having a function of grabbing by deforming the flexible finger by a Lorenz force.

Further, JP-A-8-257926 (page 4, FIG. 1) proposes an integrating method in which when the flexible finger of Japanese Patent Publication No. 3109220 is integrated, positions of front ends of grabbing portions are matched. According to the integrating method, grabbing front end members are connected to a cabinet by electrodes, thereafter, the two grabbing members are bonded by adjusting a position of the cabinet such that positions of the grabbing members are opposed to each other.

However, when a mechanism of grabbing and carrying a small sample as described in the background art of the preceding item is used, it is conceivable to bring about a change in an attitude and a shift in an angle of a small sample owing to a shape of the front end of the grabbing member. Therefore, the sample cannot be grabbed by a desired attitude by the grabbing mechanism, and therefore, it is difficult to transfer the grabbed sample in a desired attitude. Further, when the attitude of the sample is shifted, it is necessary to adjust the angle by operating a mechanism of grabbing the sample by a stage. Further, when the attitude is shifted to outside of a movable range of the stage, the attitude cannot be corrected. In order to resolve the above-described problem, shapes of the grabbing portion and the sample need to be aligned accurately within a correcting range. The invention provides a method of resolving the above-described problem and accurately grabbing and transferring a small sample.

SUMMARY OF THE INVENTION

There is proposed a method of preventing an attitude of a small sample from being changed considerably when the small sample is grabbed by a grabbing member by fabricating a grabbing face of a sample grabbing portion of a sample carrying mechanism along a beam irradiating axis by a charged particle beam. A method of adjusting a grabbing face of the invention is a working method paying attention to the fact that three of a direction of working a sample relative to a direction of irradiating a charged particle beam when a front end portion of a sample grabbing portion is worked by etching by a charged particle beam of FIB or the like, a direction of working a front end of a grabbing portion, and a direction of observing an image when the charged particle beam is scanned are the same. When a small sample represented by a TEM sample is cut out by etching to be carried at inside of a charged particle beam apparatus, the small sample is etched in a direction of irradiating the charged particle beam, and therefore, a face squeezed by the grabbing portion can be worked by the direction the same as that of working the sample. By fabricating the sample and the grabbing portion by parallel faces in working by etching, a change in an attitude when the sample is grabbed can be reduced.

In consideration of the fact of providing a method of constituting a shape suitable for carrying a small sample with regard to a grabbing shape, that is, the fact that when the small sample is carried, the sample is influenced by the shape of the sample, recesses and projections or an angular attitude of a mechanism of grabbing the sample, by working the grabbing portion by the charged particle beam of FIB or the like, the grabbing portion in parallel with the beam can be formed, further, also dust adhered to the grabbing portion is removed. By the above-described foreign object removing effect, a pertinent angle when the sample is grabbed can be provided.

According to the method of the invention, an image can be provided by scanning the charged particle beam in working, the charged particle beam is functioned as SEM in a case of an electron and functioned as FIB in a case of ion, and an accuracy of working the grabbing face can be confirmed as an image in view from the beam irradiating direction.

Further, from reason that when the sample is worked by etching, a shape profile of the beam is constituted by a normal distribution, an ideal working shape is not provided, and therefore, there is present a method of working a strict angle by irradiating a beam normally from an angle skewed more or less by 1° from an upper face of the sample by a sputter process of FIB or the like. When the grabbing portion is provided with an angle adjusting mechanism capable of dealing with vertical working, the strict angle adjustment of the grabbing face may be carried out.

A TEM sample is realized to be moved and installed safely and swiftly by grabbing a small sample by pertinent angle by the above-described method without destructing or losing the sample by a failure.

A grabbing and carrying mechanism used in realizing a method of grabbing a small sample by etching by a beam of the invention includes an actuator having front end members comprising 2 pieces of needle-like members for grabbing the sample, arranging the 2 pieces of needle-like members to be opposed to each other by making the needle-like members always proximate to each other or providing a predetermined gap therebetween and driving the 2 pieces of the needle-like members.

According to the method of grabbing a small sample of the invention, the grabbing face is formed in the beam irradiating direction by working by the charged particle beam, and therefore, grabbing the sample for the small sample can be carried out by an accuracy exceeding an accuracy of fabricating the sample grabbing portion. Further, the grabbing face can be confirmed to be formed by an image provided by scanning the charged particle beam. Further, as a result thereof, the grabbing force can be promoted by forming the grabbed face of the sample for fabricating the sample grabbing face and the grabbing face of the grabbing portion characterized in removing dust or recesses or projections of the grabbing portion by irradiating the beam in the same direction.

When the method of grabbing the small sample of the invention is used, a rotational axis necessary for rectifying the attitude when the sample is grabbed to be lifted becomes unnecessary and a mechanism of controlling an attitude of the sample grabbing portion can be omitted.

Further, when a planer shape substantially in parallel with the direction of irradiating the charged particle beam is formed, by reason that the charged particle beam is distributed by a beam current density or an etching component is adhered again, an accurate plane completely in parallel with a direction of irradiating the charged particle beam cannot be formed, and therefore, when the grabbing face is formed, by setting an angle of irradiating the charged particle beam in a direction of being skewed from the aimed direction of the grabbing face by several degrees, the inherently aimed grabbing face can be formed further accurately.

BRIEF DESCRIPTION OF THE DRAWINGS

FIG. 1 is a view of an apparatus for grabbing and transferring a small sample according to the invention.

FIGS. 2A-2D illustrate views for explaining a method of cutting out a small sample by etching according to the invention.

DETAILED DESCRIPTION OF THE PREFERRED EMBODIMENTS

Figure 3A:
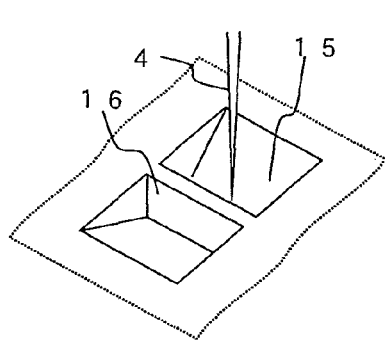
FIGS. 3A-3C illustrate views for explaining a behavior of grabbing a small sample according to the invention.

According to a method of grabbing a small sample of the invention, for resolving the problem of the attitude control, there is proposed a method of making contact faces of a small sample and a grabbing face parallel in a state in which an irradiated charged particle beam is irradiated to a small sample and a grabbing portion in the same direction. A small sample and a sample grabbing and carrying mechanism are installed at inside of the same vacuum chamber for using the charged particle beam, and for monitoring the attitude control, a secondary electron image or a reflected electron image or the like provided by scanning the charged particle beam is utilized.

FIG. 1 shows an example of an apparatus of realizing the grabbing method of the invention. A lens barrel 1 for irradiating a charged particle beam 4 is installed in a vacuum chamber 6 installed with a sample 7 constituting an object of working. The charged particle beam 4 of a focused ion beam, an electron beam or the like emitted from an ion source or an electron source 2 is focused onto the sample 7 by way of an optical system 3. The sample 7 is fixed to a sample holder 8 mounted on a sample stage 9 for positioning the beam irradiation, further, a sample grabbing and carrying mechanism 11 constituted by a biaxial or more of movable stage is positioned to be able to be operated in a charged particle beam irradiating region, and the sample is grabbed or carried by combining operations of the sample grabbing and carrying mechanism 11 and the sample stage 9. Inside of the vacuum chamber 6 is mounted with a secondary charged particle detector 5 for providing an image by scanning the charged particle beam 4 as well as a gas gun 10 for supplying a gas.

According to a small sample grabbing method of the invention, a stable grabbing method with an object of carrying a small sample 20 is shown, and when the small sample 20 used for TEM observation or the like is not previously fabricated, an arbitrary observation portion is cut out from a circuit board or the like and is carried. FIGS. 2A-2D show a method of fabricating the small sample 20. The sample is irradiated with the charged particle beam 4 while being assisted by a gas 14 for preventing a damage by the charged particle beam 4 to form a deposition film 14 (FIG. 2A). Thereafter, a periphery of an object of observation is worked successively by etching to form a front hole 15, a rear hole 16 (FIG. 2B and FIG. 2C), and working for cutting out a small sample including an observation object is carried out (FIG. 2D). Further, other than a gas for forming the deposition film 13, there is also present a gas of increasing an etching rate by irradiating the charged particle beam 4 while supplying a gas in accordance with a sample to be worked, also the sample used in the invention at current time may be worked swiftly by being assisted by the gas. For example, it is known that an etching rate is increased by using xenon fluoride ($XeF_2$) when a silicon board is etched and water ($H_2O$) when diamond is etched as assistance.

Figure 3B:
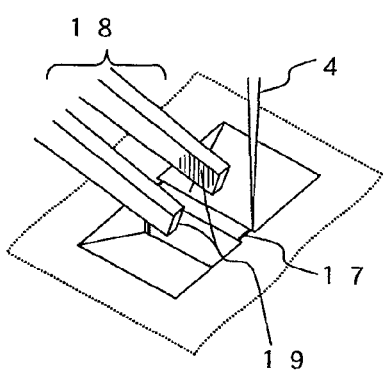
Figure 3C:
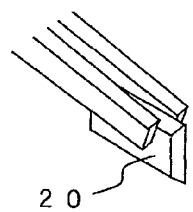

FIGS. 3A-3C show a behavior of pulling up the small sample 20 used in TEM for grabbing and carrying the small sample 20. A periphery of the object of observation is preparatorily worked by etching the front hole 15 and the rear hole 16 by the charged particle beam 4 (FIG. 3A). Next, a grabbing portion 18 is made to approach the sample for moving the sample to a holder for observation (FIG. 3B). Finally, a cut work portion 17 is fabricated by irradiating the charged particle beam 4, the small sample 20 which can be grabbed and separated is pulled up in a state of being pinched by the grabbing portion 18 of the sample carrying mechanism and is moved to an arbitrary location (FIG. 3C).

An attitude of the sample pulled up in FIGS. 3A-3C depend on a shape of the grabbing portion 18. Further, even in a case in which attachment of the grabbing portion 18 is inclined to a stage face, a case in which an accuracy of attaching the grabbing and carrying mechanism or an accuracy of working a front end of the grabbing portion is poor, or a case in which dust is attached to a grabbing face, the cases constitute factors of changing the attitude of the sample. Hence, the change in the attitude of the sample can be reduced when the sample is grabbed by directing a face of the sample formed by etching by the charged particle beam and a grabbing face 19 of the grabbing portion opposed thereto in the same direction. FIGS. 4A-4E show a specific example for alleviating the change in the attitude.

Figures 4A, 4B, 4C, 4D, 4E:
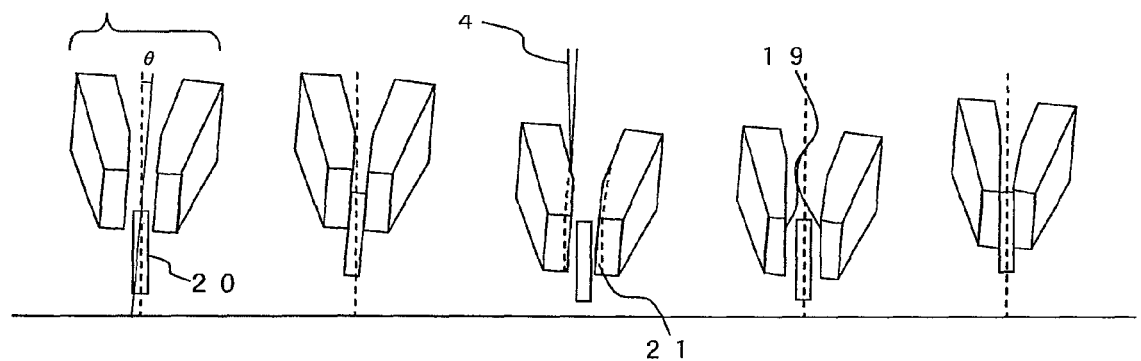
FIGS. 4A-4E illustrate views for explaining a method of reducing a difference of attitudes of a grabbing face according to the invention and a small sample by working the grabbing face by a charged particle beam.

FIG. 4A: The grabbing portion 18 is disposed at a front end of the sample grabbing and carrying mechanism 11 in the drawing of the apparatus of FIG. 1. The angle of inclining the grabbing portion 18 to the small sample 20 depends on the accuracy of attaching the sample grabbing and carrying mechanism 11 attached to inside of the apparatus, and an accuracy of fabricating and an accuracy of an angle of the grabbing portion 18.

FIG. 4B: When the grabbing portion is shifted from a vertical axis of the sample 7 by an angle θ, in a case in which the grabbed small sample 20 is ideally worked by a vertical face, the small sample 20 is grabbed by being inclined by the angle θ of an amount of inclining the grabbing portion, and when a carrying destination is disposed on the stage of FIG. 1, the small sample 20 is installed similarly by the inclined angle of an amount of the angle θ.

FIG. 4C: Hence, by etching to remove a worked portion 21 constituting a grabbing face of the grabbing portion 18 by the charged particle beam 4, the flat grabbing face 19 is formed in a direction substantially in parallel with a direction of irradiating the charged particle beam.

FIG. 4D: So far as the small sample 20 is not previously fabricated, an arbitrary observation portion is cut out from a circuit board or the like, and therefore, a side wall is substantially in parallel with the direction of irradiating the charged particle beam 4, even when the small sample 20 is grabbed by the grabbing portion 18, the small sample 20 is pulled up in a state in which the angle is not changed and can be moved to an arbitrary location.

Further, a mode of a method of driving the grabbing portion 18 is not limited such that the grabbing portion 18 may be operated by a piezoelectric, electromagnetically driven, or electrostatic actuator or such as a device of an MEMS mechanism fabricated by a semiconductor process.

EXAMPLE 1

FIGS. 5A-5F show an example of carrying a TEM sample using a method of the patent.

Figure 5A:
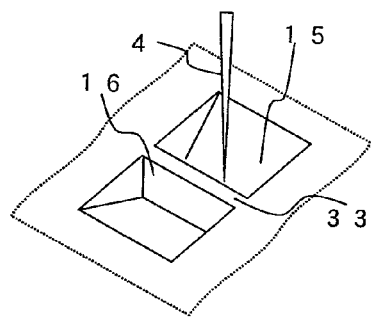
FIGS. 5A-5F illustrate views for explaining carrying of a TEM sample of example 1.

FIG. 5A: First, a thin piece portion 33 is formed by forming the front hole 15, the rear hole 16 by etching by the charged particle beam 4 at a vicinity of a portion of carrying out TEM observation.

Figure 5B:
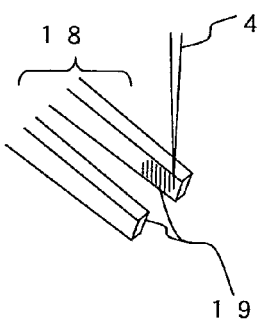

FIG. 5B: Simultaneously, also a grabbing face 19 is formed such that an inner side of a front end of the grabbing portion 18 is flattened by scanning in a direction the same as that in forming a side face of the thin piece portion 33 by the charged particle beam 4.

Figure 5C:
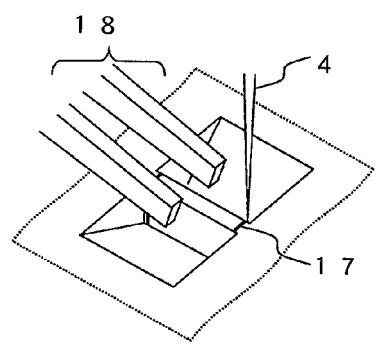

FIG. 5C: The sample cut to be separated by etching the cut work portion 17 by the charged particle beam 4 is grabbed by the grabbing portion 18 to be pulled up.

Figure 5D:
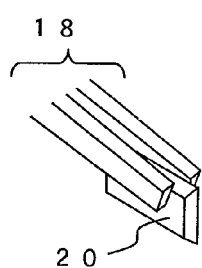

FIG. 5D: The pulled up small sample 20 for TEM observation is flattened by etching, and therefore, the small sample 20 can be carried without deteriorating an attitude thereof.

Figure 5E:
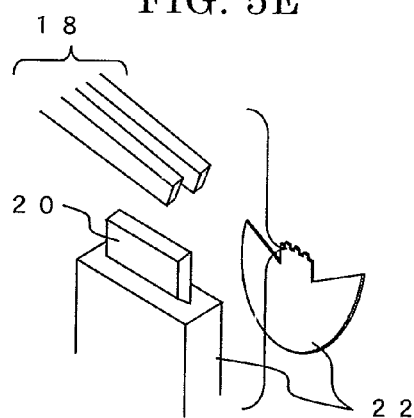

FIG. 5E: The small sample 20 is installed at a grid 22 exclusive for a TEM sample for mounting the small sample 20 on a holder for observation.

Figure 5F:
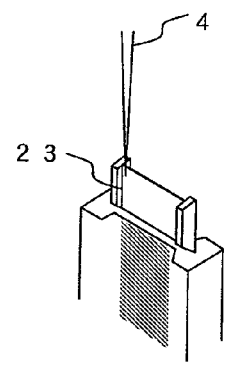

FIG. 5F: The small sample 20 on the grid for TEM sample is sliced by the charged particle beam 4 and finished to be worked into a TEM sample 23 sliced by leaving a region intended to be observed.

EXAMPLE 2

Figure 6A:
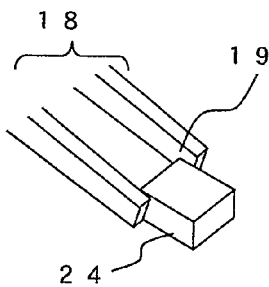
FIGS. 6A and 6B illustrate views for explaining carrying of a small device element of example 2.
Figure 6B:
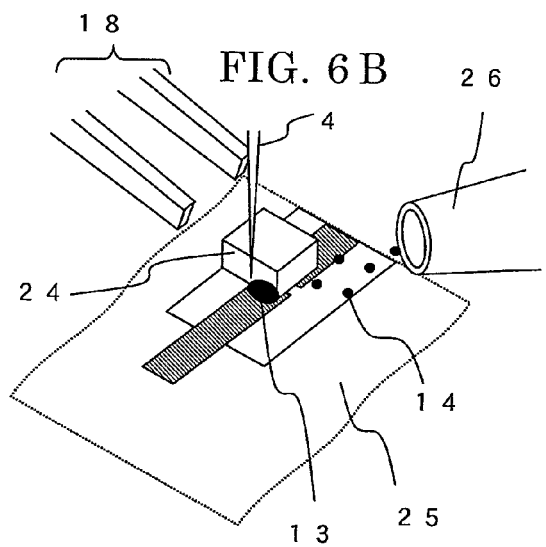

FIGS. 6A and 6B show an example of carrying an optical device. An attitude of the device is prevented from being changed considerably by grabbing and carrying a device element 24 in a state of aligning the grabbing face similar to example 1.

FIG. 6A: The device element 24 grabbed by the flattened grabbing face 19 is carried to a predetermined location while maintaining an attitude thereof.

FIG. 6B: By irradiating the charged particle beam 4 while supplying a raw material gas 14 from a gas gun nozzle 26, the raw material gas can be deposited to be fixed. Although when the raw material gas is phenanthrene or naphthalene, the deposition film 13 of carbon is formed, when a metal organic compound of hexacarbonyl tungsten or methylcyclopentadienyltrimethyl platina or the like is used for the raw material gas, the film 13 having an electric resistance lower than that of the carbon film is formed, and therefore, the raw material gas 14 is selected in accordance whether the film is electrically connected.

EXAMPLE 3

FIGS. 7A-7F show an example of carrying a sample of an atom probe electric field microscope using the patent. The atom probe electric field ion microscope is an analyzing apparatus in which by applying a voltage to a sample of a needle-like shape to be pulled out and carrying out mass spectroscopy of the ionized sample from a sharpened front end, an atom thereof is identified. Although a pulled-up local sample portion can be analyzed three-dimensionally including a light element, since the sample is fabricated by the shape of the small needle, a result differs by a direction of inclining the sample, and therefore, attitude control is an important item.

Figure 7A:
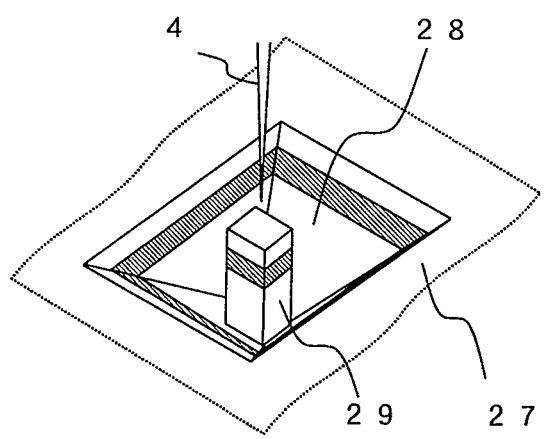
FIGS. 7A-7F illustrate views for explaining carrying of a sample of an atom probe of example 3.

FIG. 7A: In order to pull up an atom probe cut-out sample 29, at a portion of a board sample 27 used for atom probe analysis, a large worked hole 28 is provided at a surrounding thereof by the charged particle beam 4.

Figure 7B:
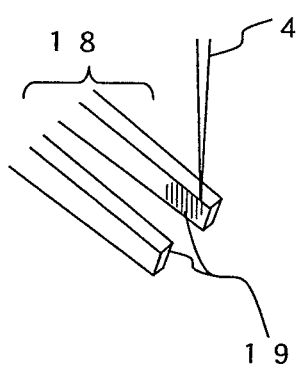

FIG. 7B: Simultaneously, also an inner side of a front end of the grabbing portion 18 is flattened by the charged particle beam 4 in a scanning direction the same as that when a grabbed side face of the sample 29 is formed to form a grabbing face 19.

Figure 7C:
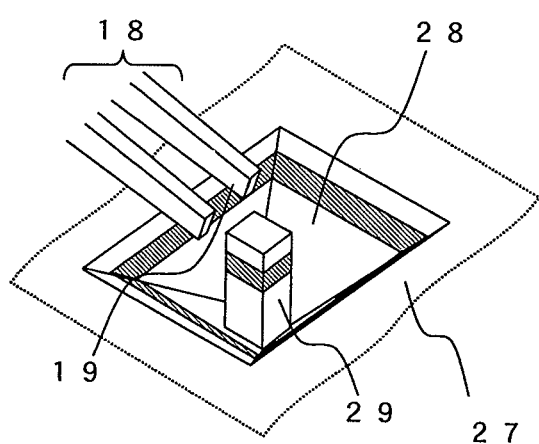
Figure 7D:
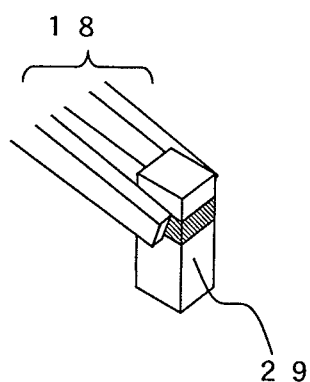

FIGS. 7C, 7D: The atom probe cut-out sample is pulled up by the grabbing portion 18 and transferred.

Figure 7E:
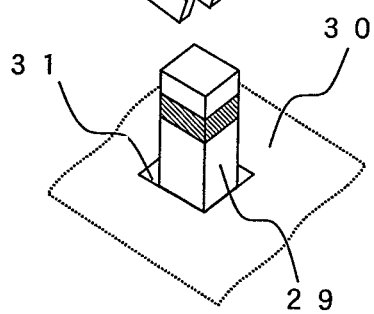

FIG. 7E: The sample 29 is carried to a fixed base 30 for working the sample 29 by a needle-like shape, installed at inside of an atom probe fixing hole 31 such that the cut-out sample does not fly even when the sample 29 is applied with a high voltage, a deposition film is deposited at a surrounding thereof by irradiating the charged particle beam while supplying a gas to be fixed solidly.

Figure 7F:
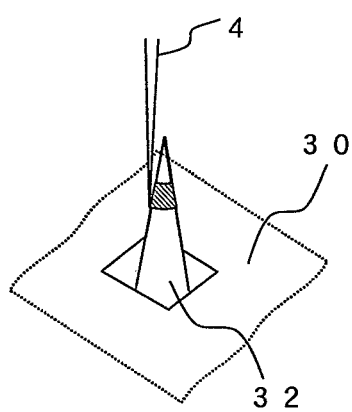

FIG. 7F: The atom probe cut-out sample is worked by a needle-like shape by etching by the charged particle beam to constitute a sample 32 of the atom probe.

Although an explanation has been given of the method of grabbing the sample worked by the charged particle beam, even when an object which is not needed to be worked by the charged particle beam, a sample piece worked by other apparatus or the like is charged by tweezers, a method of working grabbing faces of the tweezers by the charged particle beam such that the grabbing faces are in parallel with grabbed faces of a sample by the above-described method is effective.

Further, although a description has been given of the method of fabricating the grabbing face of the sample grabbing portion in the above-described examples, also a sample carrying mechanism having a sample grabbing portion having a grabbing face fabricated by the above-described method falls in the range of the invention.

What is claimed is:

1. A method for carrying a sample comprising the steps of:
   etching a grabbing portion of a grabbing member using a charged particle beam
   in order to form grabbing faces of the grabbing portion that are substantially in parallel with a grabbed face of the sample; and
   carrying the sample by grabbing the sample with the etched grabbing portion.

2. The method for carrying a sample according to claim 1, wherein the charged particle beam is a focused ion beam.

3. The method for carrying a sample according to claim 1, further comprising:
   etching a periphery area of the sample with the charged particle beam while supplying a gas for promoting the etching.

4. The method for carrying a sample according to claim 1, wherein etching the grabbing portion further comprises etching the grabbing portion of the grabbing member using an electron beam while supplying a gas suitable for promoting the etching.

5. The method for carrying a sample according to claim 1, wherein forming the grabbing faces of the grabbing portion further comprises:
   setting an angle of irradiating the charged particle beam to be in a direction of being skewed to the grabbing face of the grabbing portion by several degrees.

6. The method for carrying a sample according to claim 1, further comprising:
   adjusting an angle of a sample stage or the grabbing member such that an angle of incidence of the charged particle beam when the grabbed face of the sample is formed and an angle of incidence when the grabbing face is formed are identical.

7. The method for carrying a sample according to claim 1, further comprising:
   etching the grabbed faces of the sample to be vertical; and
   scanning the grabbing face of the grabbing member with the charged particle beam in the same direction as the vertical direction of the grabbed faces.

8. The method for carrying a sample according to claim 7, the sample is a sample for observing by a transmission Electron Microscope (TEM).

9. The method for carrying a sample according to claim 7, wherein the sample is a sample for producing an atom probe of an atom probe electric field microscope.

10. The method for carrying a sample according to claim 1, wherein the sample is an optical device.

\* \* \* \* \*